United States Patent [19]

Takemura et al.

[11] Patent Number: 5,099,304
[45] Date of Patent: Mar. 24, 1992

[54] SEMICONDUCTOR DEVICE WITH INSULATING ISOLATION GROOVE

[75] Inventors: Hisashi Takemura; Mitsuhiro Sugiyama, both of Tokyo, Japan

[73] Assignee: NEC Corporation, Japan

[21] Appl. No.: 448,076

[22] Filed: Dec. 8, 1989

[30] Foreign Application Priority Data

Dec. 8, 1988 [JP] Japan .................. 63-311143

[51] Int. Cl.$^5$ ............................................. H01L 27/12
[52] U.S. Cl. ........................................ 357/49; 357/47; 357/50; 357/55; 437/67
[58] Field of Search ................. 357/47, 49, 50, 55; 437/67

[56] References Cited

U.S. PATENT DOCUMENTS

| | | | |
|---|---|---|---|
| 4,404,735 | 9/1983 | Sakurai | 357/49 |
| 4,471,525 | 9/1984 | Sasaki | 357/50 |
| 4,621,414 | 11/1986 | Iranmanesh | 357/49 |
| 4,740,480 | 4/1988 | Ooka | 357/49 |
| 4,810,669 | 3/1989 | Kobayashi | 357/49 |
| 4,819,054 | 4/1989 | Kawaji et al. | 357/49 |
| 4,835,115 | 5/1989 | Eklund | 357/49 |
| 4,855,804 | 8/1989 | Bergami et al. | 357/49 |
| 4,888,300 | 12/1989 | Burton | 357/49 |

FOREIGN PATENT DOCUMENTS 155853  3/1989  Japan .................. 357/47

Primary Examiner—Rolf Hille
Assistant Examiner—Steven Loke
Attorney, Agent, or Firm—Laff, Whitesel, Conte & Saret

[57] ABSTRACT

A semiconductor device comprising an insulating isolation groove which comprises a groove in a substrate, an insulating film on the inner surface of the groove, a polycrystal silicon film and a boron phosphosilicate glass film in order embedded within the groove, and a silicon oxide film on the boron phosphosilicate glass film.

Since the polycrystal silicon film and boron phosphosilicate glass film are embedded within the groove, the crystal defect due to thermal expansion does not occur. And, since it is not necessary to oxidize the surface of the polycrystal silicon film within the groove, deformation due to an increased build-up at the time of oxidation does not occur.

2 Claims, 4 Drawing Sheets

SEMICONDUCTOR DEVICE WITH INSULATING ISOLATION GROOVE

BACKGROUND OF THE INVENTION

1. Field of the Invention

This invention relates to a silicon semiconductor device and a method for manufacturing the same, particularly to an insulating isolation groove between electronic elements and a method for manufacturing the same.

2. Description of the Prior Art

In the past, an isolation of the element by the groove of this kind has been performed by embedding a polycrystal silicon film 6b within a groove and oxidizing the top surface of the polycrystal silicon film 6b to form an insulating film such as a silicon oxide film 9, as shown in FIG. 1 (c), or by embedding an insulating film such as a boron phosphosilicate glass film 8 or the like within a groove as shown in FIG. 2 (c).

FIGS. 1 (a)–(c) show a sectional view illustrating in order each step of a prior process for forming an isolation groove by embedding a polycrystal silicon film within a groove. FIG. 1 (a) shows a product formed by forming in order a silicon oxide film 2 and a silicon nitride film 3 on the top surface of a silicon wafer substrate 1, making an opening selectively in the silicon nitride film 3 and the silicon oxide film 2 by a photoetching method, then forming a groove having a depth of 3–5 μm in the silicon substrate 1 exposed in the opening by an anisotropic etching method, forming a silicon oxide film 4 having a thickness of 1000Å on the inner surface of the groove by using the silicon nitride film 3 as a non-oxidizable mask and allowing a polycrystal silicon film 6 to grow by a low pressure CVD method till the surface thereof practically becomes flat. Then, as shown in FIG. 1 (b), the polycrystal silicon film 6 is etched back so as to make the surface of the polycrystal silicon film 6 consistent with the surface of the silicon substrate 1. Thereafter, as shown in FIG. 1 (c), the resulting polycrystal silicon film 6b is oxidized using the silicon nitride film 3 as a mask to form a silicon oxide film 9 and the silicon nitride film 3 is removed to form an isolation groove.

FIGS. 2 (a)–(c) show each step of the prior second process for manufacturing an isolation groove. FIG. 2 (a) shows steps which comprise a product formed by forming a groove and forming a silicon oxide film 4 on the inner surface of the groove as shown in FIG. 1 (a), and thereafter removing a silicon nitride film 3, forming a silicon nitride film 5 and embedding a boron phosphosilicate glass film 7 within the groove. Then, as shown in FIG. 2 (b), a thermal treatment is carried out to allow a boron phosphosilicate glass film 7b to reflow. Thereafter, as shown in FIG. 2 (c), the boron phosphosilicate glass film 7b is etched back to make the surface of the resulting boron phosphosilicate glass film 7c consistent with the surface of the silicon substrate 1, and then a silicon oxide film 8 is built up to form an isolation groove.

The prior isolation groove as mentioned above, in case of the construction wherein the polycrystal silicon film 6b is embedded within the groove as shown in FIG. 1 (c), brings about an increase in capacitance between electronic elements as compared with that of the construction having the embedded insulating film and thus is an obstacle to a speeding-up of the element. In addition, since the surface of the polycrystal silicon film 6b is oxidized when the groove is formed, a crystal defect occurs in a region of the element and thus a problem is raised in the element characteristics. Moreover, the thickness of the silicon oxide film 9 decreases at the end of the sidewall of the groove as shown in a circle indicated with an arrow in FIG. 1 (c). Therefore, there is a defect that in the case that when a hole leading to the element region is provided, if an allowance between the hole and the groove is reduced, a hole is formed also on the polycrystal silicon film within the groove, whereby a problem such as a short-circuit between the elements or the like is raised. In the case that the insulating film 7c such as a boron phosphosilicate glass film of the like is embedded within the groove as shown in FIG. 2 (c), a problem of a deformation is raised due to the difference in coefficient of thermal expansion between the silicon of the element region and the insulating film. In addition, there is a defect that the short-circuit due to an aluminum residue occurs in the subsequent processing step, since a "void" occurs within the boron phosphosilicate glass film in the embedding step as shown in FIG. 2 (a) and as a result, a difference in level occurs on the top surface of the groove after reflowing.

SUMMARY OF THE INVENTION

It is an object of this invention to provide an improved semiconductor device, wherein a crystal defect due to an insulating film which was embedded in a groove isolation region or a crystal defect caused when a groove isolation is performed is reduced and in addition problems of the short-circuit due to the shape of the groove and the like are solved.

It is another object of this invention to provide a method for manufacturing the above semiconductor device.

The above object is accomplished by providing the semiconductor device, according to this invention, which comprises a groove formed in a silicon semiconductor substrate in the direction of from one main surface of the silicon semiconductor substrate toward the interior thereof, an insulating film formed on the sidewall and bottom of the groove, a polycrystal silicon film which is partially embedded on the insulating film to a certain height from the bottom of the groove so as to leave a space on the polycrystal silicon film, a boron phosphosilicate glass film embedded on the polycrystal silicon film within the said space of the groove and a silicon oxide film covering the top surface of the boron phosphosilicate glass film.

Moreover, the above another object of this invention is accomplished by providing a method for manufacturing a semiconductor device, according to this invention, which comprises the steps of:

forming a groove in a silicon semiconductor substrate in the direction of from one main surface of the silicon semiconductor substrate toward the interior thereof;

forming an insulating film on the inner surface of the groove;

building up a polycrystal silicon film on the insulating film to fill the interior of the groove;

etching back the polycrystal silicon film so as to leave a space to a depth of not less than 0.3 μm in the groove;

building up a boron phosphosilicate glass film thereon;

allowing the boron phosphosilicate glass film to reflow to make it flat;

etching back the boron phosphosilicate glass film so as to leave the boron phosphosilicate glass film within the groove; and covering the boron phosphosilicate glass film with a silicon oxide film.

In the present invention, the insulating film is preferably formed of a silicon oxide film formed on the inner surface of the groove and a silicon nitride film built up on the silicon oxide film.

The silicon nitride film functions as a barrier to prevent a boron atom or phosphorus atom from diffusing from the boron phosphosilicate glass film to the silicon semiconductor substrate.

Further, in the present invention, the boron phosphosilicate glass film is preferably formed by a low pressure chemical vapor deposition method due to a thermal decomposition of tetraethoxyorthosilicate (TEOS). If a boron phosphosilicate glass film is built up due to a thermal decomposition of TEOS by using a low pressure CVD method, it becomes possible to make the surface flatter.

It will be appreciated that with the semiconductor device according to this invention wherein the polycrystal silicon film and boron phosphosilicate glass film are embedded within the groove, the crystal defect due to thermal expansion does not occur. And, since it is not necessary to oxidize the surface of the polycrystal silicon film within the groove, deformation due to an increased build-up at the time of oxidation does not occur. In addition, since the depth of below the surface of the silicon substrate to the surface of the polycrystal silicon film within the groove is sufficiently deeper than the thickness of the insulating film on the silicon substrate, when a contact hole leading to the element region formed in the silicon semiconductor substrate 1 is made, it becomes possible to reduce an allowance between the contact hole and the groove to the minimum and thus to make a microminiaturized element. Also, if a depth at which the boron phosphosilicate glass film is embedded is controlled within 2 μm, the "void" as shown in FIG. 2 (a) does not occur when the boron phosphosilicate glass film is built up and a flatness of the top surface of the groove is remarkably improved.

BRIEF DESCRIPTION OF THE DRAWINGS

By way of embodiment of the many features and advantages of the invention, an illustrative embodiment in the form of a semiconductor device is described below and shown in the accompanying drawings in which.

DETAILED DESCRIPTION OF THE PREFERRED EMBODIMENT

This invention will be described with reference to the accompanying drawings.

Figure 1A:
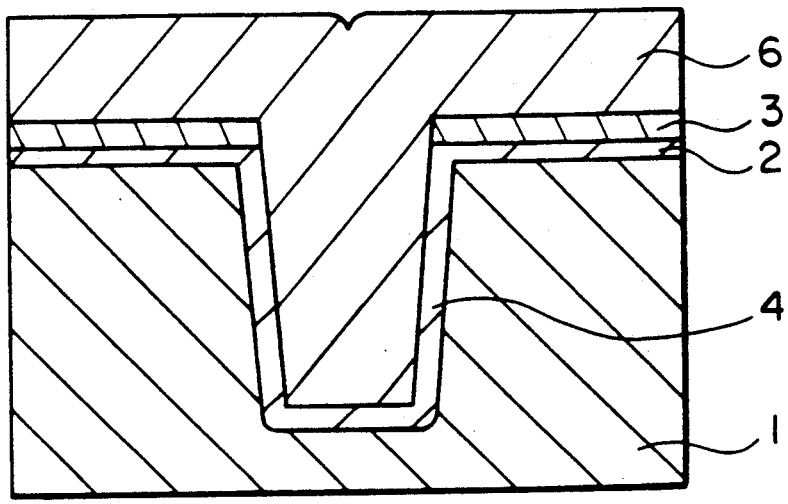
FIGS. 1 (a)–(c) show a sectional view of one embodiment of the prior semiconductor device, in the order of the manufacturing process.
Figure 1B:
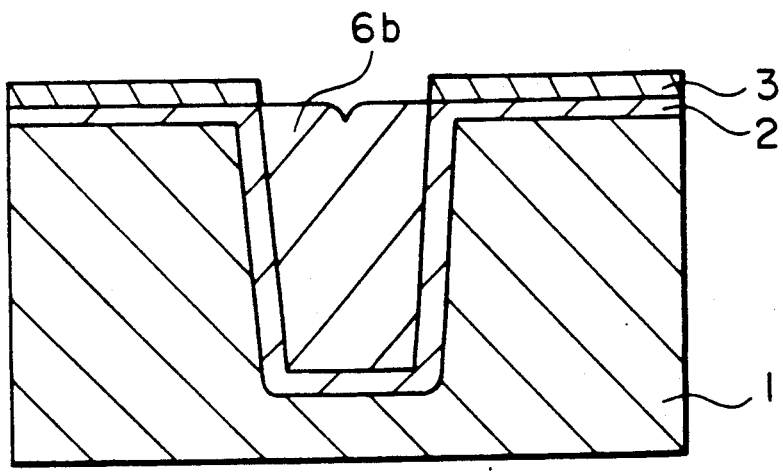
Figure 1C:
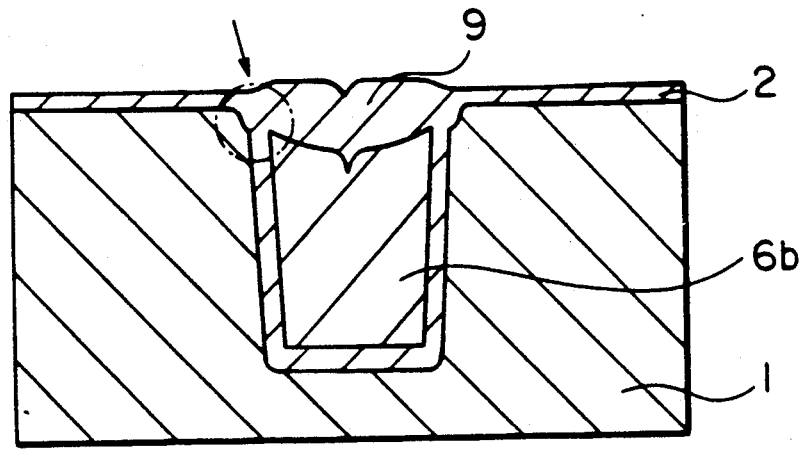
Figure 2A:
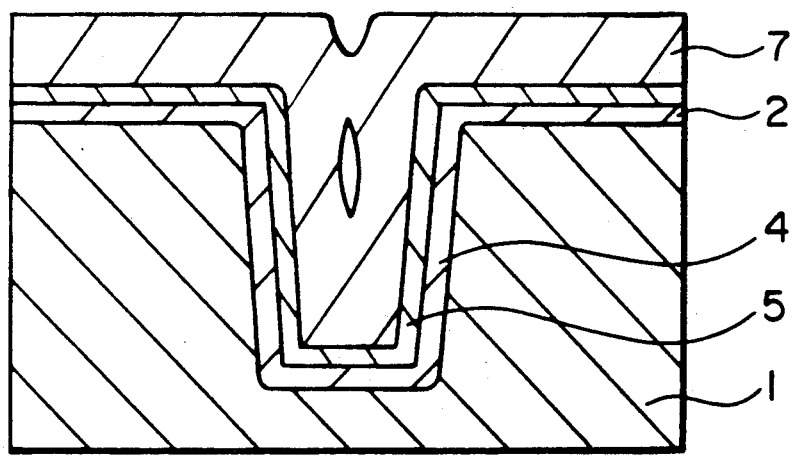
FIGS. 2 (a)–(c) show a sectional view of another embodiment of the prior semiconductor device, in the order of the manufacturing process.
Figure 2B:
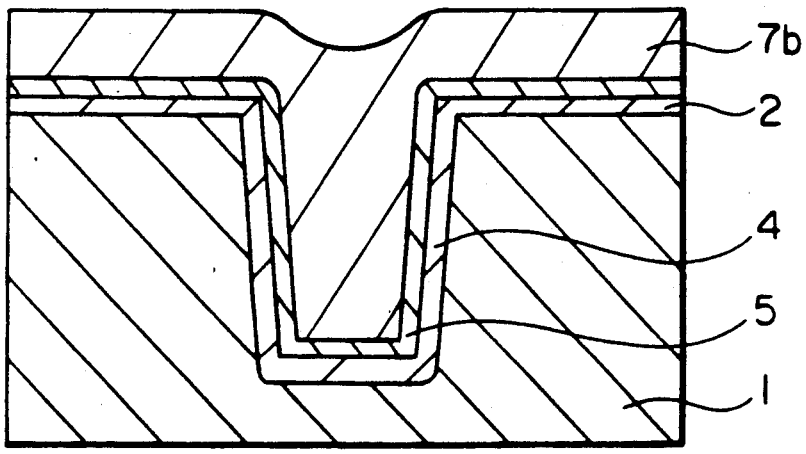
Figure 2C:
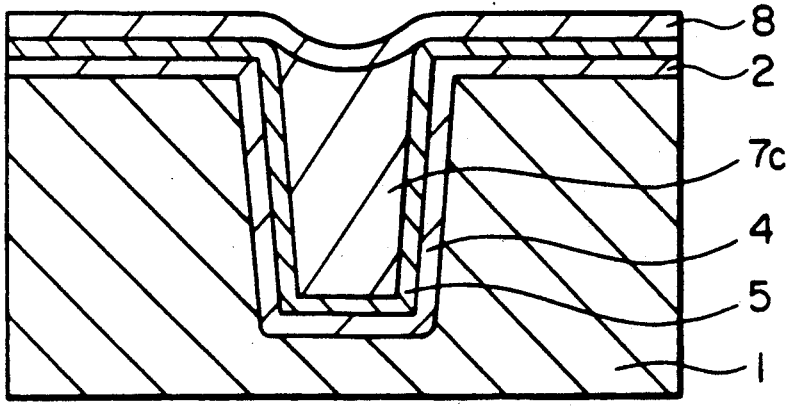
Figure 3:
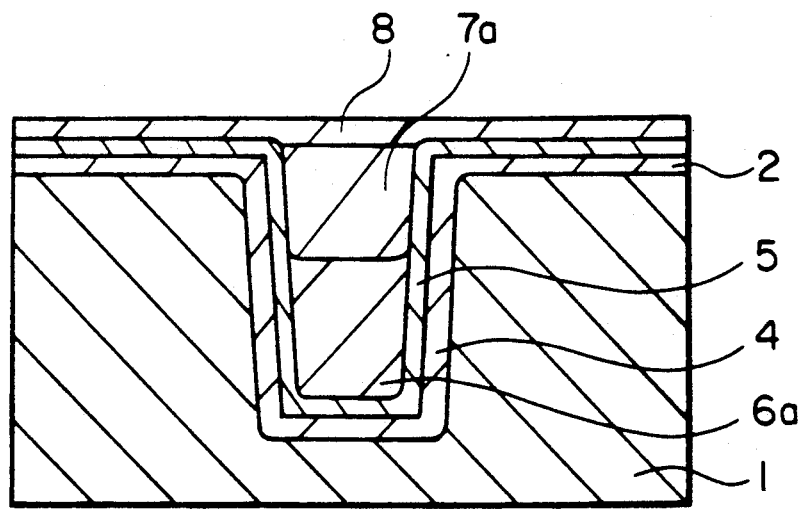
FIG. 3 shows a sectional view of a semiconductor device according to one embodiment of this invention.

FIG. 3 shows a sectional view of one embodiment of a semiconductor device according to this invention.

As shown in FIG. 3, in the semiconductor device of this invention, a silicon oxide film 4 is formed on the inner surface of a groove formed in a silicon semiconductor substrate 1 and a silicon nitride film 5 is built up on the silicon oxide film. And, the lower part of the groove is filled with a polycrystal silicon film 6a and the upper part thereof is filled with a boron phosphosilicate glass film 7a. The top surface of the filled groove is covered with a silicon oxide film 8.

Figure 4A:
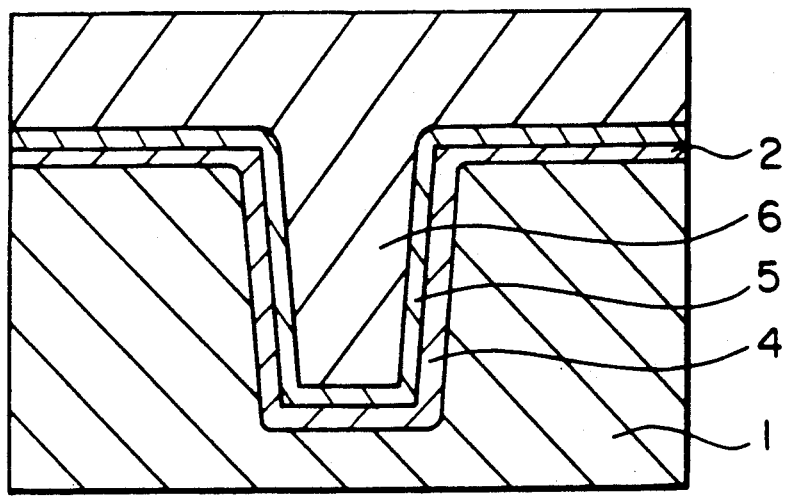
FIGS. 4 (a)–(c) show a sectional view of a semiconductor device according to one embodiment of this invention, in the order of the manufacturing process.
Figure 4B:
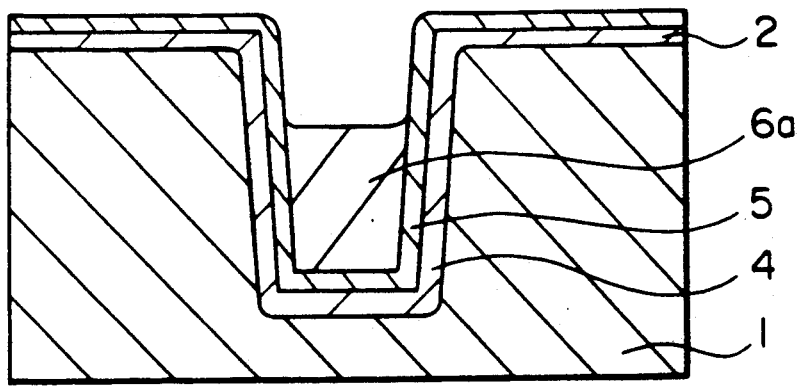
Figure 4C:
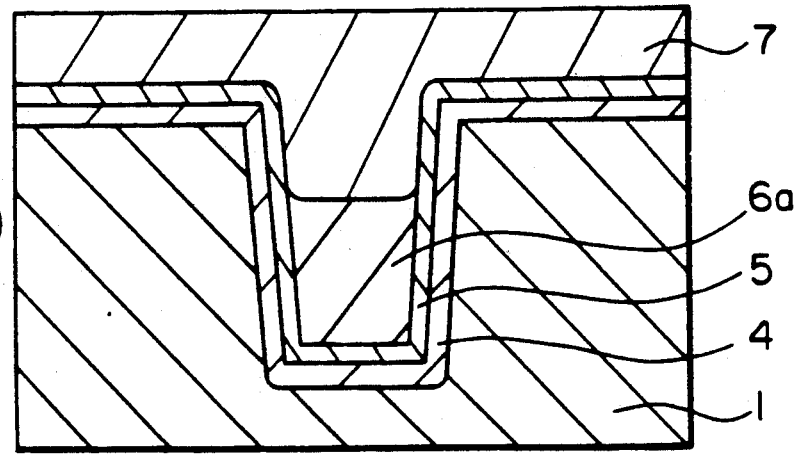

FIGS. 4 (a)–(c) and FIG. 3 are a sectional view illustrating one embodiment of this invention in the order of the manufacturing process.

As shown in FIG. 4 (a), a silicon oxide film 2 having a thickness of 1000Å is formed on a silicon semiconductor substrate 1 by a thermal oxidation method, an opening is selectively made in the silicon oxide film 2 by a photoetching method, then a groove having a depth of 4 μm is formed in the silicon semiconductor substrate 1 exposed to the opening by an anisotropic etching method, the inner wall of the groove is selectively oxidized to form a silicon oxide film 4 having a thickness of 2000Å, a silicon nitride film 5 is built up to 1000Å thickness by a low pressure CVD method, and a polycrystal silicon film 6 is built up to 2 μm thickness. Then, as shown in FIG. 4 (b), the polycrystal silicon film 6 is etched back to the depth of 0.3–0.5 μm below the surface of the silicon semiconductor substrate 1. Thereafter, as shown in FIG. 4 (c), a boron phosphosilicate glass film 7 is built up to 2 μm thickness and a thermal treatment is carried out under 900°–1000° C. to allow the resulting boron phosphosilicate glass film 7 to reflow and to make the surface thereof flat.

Then, as shown in FIG. 3, the boron phosphosilicate glass film 7 is treated by hydrofluoric acid or the like so that a part of the film, i.e. a boron phosphosilicate glass film 7a, is left in the groove so as to make the surface of the filled groove flat, and thereafter a silicon oxide film 8 is allowed to grow. In this case, if a boron phosphosilicate glass film is built up due to a thermal decomposition of TEOS by using a low pressure CVD method, it becomes possible to make the surface flatter. In addition, a formation of the silicon nitride film 5 within the groove is effective to prevent a boron atom or a phosphorus atom from diffusing from the boron phosphosilicate glass film to the silicon semiconductor substrate 1.

What is claimed is:

1. A semiconductor device which comprises:

a groove having a depth of 4 μm and formed in a silicon semiconductor substrate in a direction extending from one main surface of the silicon semiconductor substrate toward the interior thereof;

an insulating film formed of a silicon nitride film and a silicon oxide film built under said silicon nitride film on the sidewall and bottom of said groove;

a polycrystal silicon film filling the groove on said silicon nitride film, a top surface of said polycrystal film being recessed downwardly by a predetermined depth from the top surface of the silicon substrate;

a boron phosphosilicate glass film filling said recessed depth on the polycrystal film, a top surface of said glass film being coplanar with the top surface of said groove; and a silicon oxide film covering the top surface of the boron phosphosilicate glass film.

2. A semiconductor device as claimed in claim 1, wherein the boron phosphosilicate glass film is filled upon said polycrystal silicon film within 2 μm in depth.

* * * * *